(12) United States Patent
Sharma et al.

(10) Patent No.: US 10,255,000 B2
(45) Date of Patent: Apr. 9, 2019

(54) DELAYED DATA RELEASE AFTER PROGRAMMING TO REDUCE READ ERRORS IN MEMORY

(71) Applicant: Western Digital Technologies, Inc., Irvine, CA (US)

(72) Inventors: Sahil Sharma, San Jose, CA (US); Philip Reusswig, Mountain View, CA (US); Nian Niles Yang, Mountain View, CA (US); Rohit Sehgal, San Jose, CA (US); Gautham Reddy, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 10 days.

(21) Appl. No.: 15/408,943

(22) Filed: Jan. 18, 2017

(65) Prior Publication Data

US 2018/0203642 A1    Jul. 19, 2018

(51) Int. Cl.
| | |
|---|---|
| *G06F 3/06* | (2006.01) |
| *G11C 16/28* | (2006.01) |
| *G11C 16/10* | (2006.01) |
| *G11C 11/56* | (2006.01) |
| *G11C 16/16* | (2006.01) |

(Continued)

(52) U.S. Cl.
CPC .......... *G06F 3/0659* (2013.01); *G06F 3/0619* (2013.01); *G06F 3/0679* (2013.01); *G11C 11/5628* (2013.01); *G11C 11/5635* (2013.01); *G11C 11/5642* (2013.01); *G11C 16/10* (2013.01); *G11C 16/16* (2013.01); *G11C 16/28* (2013.01); *G11C 16/3459* (2013.01); *G11C 16/0483* (2013.01)

(58) Field of Classification Search
CPC .................................................. G06F 12/0246
See application file for complete search history.

(56) References Cited

U.S. PATENT DOCUMENTS

| | | |
|---|---|---|
| 5,905,993 A | 5/1999 | Shinohara |
| 7,877,540 B2 | 1/2011 | Sinclair |
| 8,982,617 B1 | 3/2015 | Mekhanik et al. |

(Continued)

OTHER PUBLICATIONS

Cai, Yu, et al., "Data Retention in MLC NAND Flash Memory: Characterization, Optimization, and Recovery," 2015 IEEE 21st International Symposium on High Performance Computer Architecture (HPCA), Mar. 9, 2015, 13 pages.

(Continued)

*Primary Examiner* — Edward J Dudek, Jr.
(74) *Attorney, Agent, or Firm* — Vierra Magen Marcus LLP

(57) ABSTRACT

A memory device and associated techniques avoid reading memory cells immediately after programming when uncorrectable errors may be present. In one aspect, data is copied from one block to another block and a timer is started after the copying is completed. If a read command is received before the timer has expired, the read operation proceeds by reading the one block. If the read command is received after the timer has expired, the read operation proceeds by reading the another block. This approach is particular suitable when data is copied from single-level cell (SLC) blocks to multi-level cell (MLC) blocks in a folding operation. The duration of the timer can be increased at lower temperatures.

20 Claims, 20 Drawing Sheets

(51) Int. Cl.
*G11C 16/34* (2006.01)
*G11C 16/04* (2006.01)

(56) References Cited

U.S. PATENT DOCUMENTS

| | | | |
|---|---|---|---|
| 9,021,187 B2 | 4/2015 | Sela et al. | |
| 9,324,439 B1 | 4/2016 | Chen et al. | |
| 2009/0199074 A1* | 8/2009 | Sommer | G06F 11/1072 |
| | | | 714/763 |
| 2012/0224425 A1* | 9/2012 | Fai | G11C 11/5642 |
| | | | 365/185.09 |
| 2014/0289453 A1* | 9/2014 | Takeda | G06F 12/0246 |
| | | | 711/103 |
| 2015/0178189 A1* | 6/2015 | Lasser | G06F 12/0246 |
| | | | 714/6.11 |
| 2015/0255150 A1* | 9/2015 | Kim | G11C 13/004 |
| | | | 365/148 |
| 2016/0266826 A1* | 9/2016 | Ooneda | G11C 29/789 |
| 2017/0177236 A1* | 6/2017 | Haratsch | G06F 3/065 |
| 2018/0203642 A1* | 7/2018 | Sharma | G06F 3/0659 |

OTHER PUBLICATIONS

U.S. Appl. No. 15/191,898, filed Jun. 24, 2016 by Yip et al.

\* cited by examiner

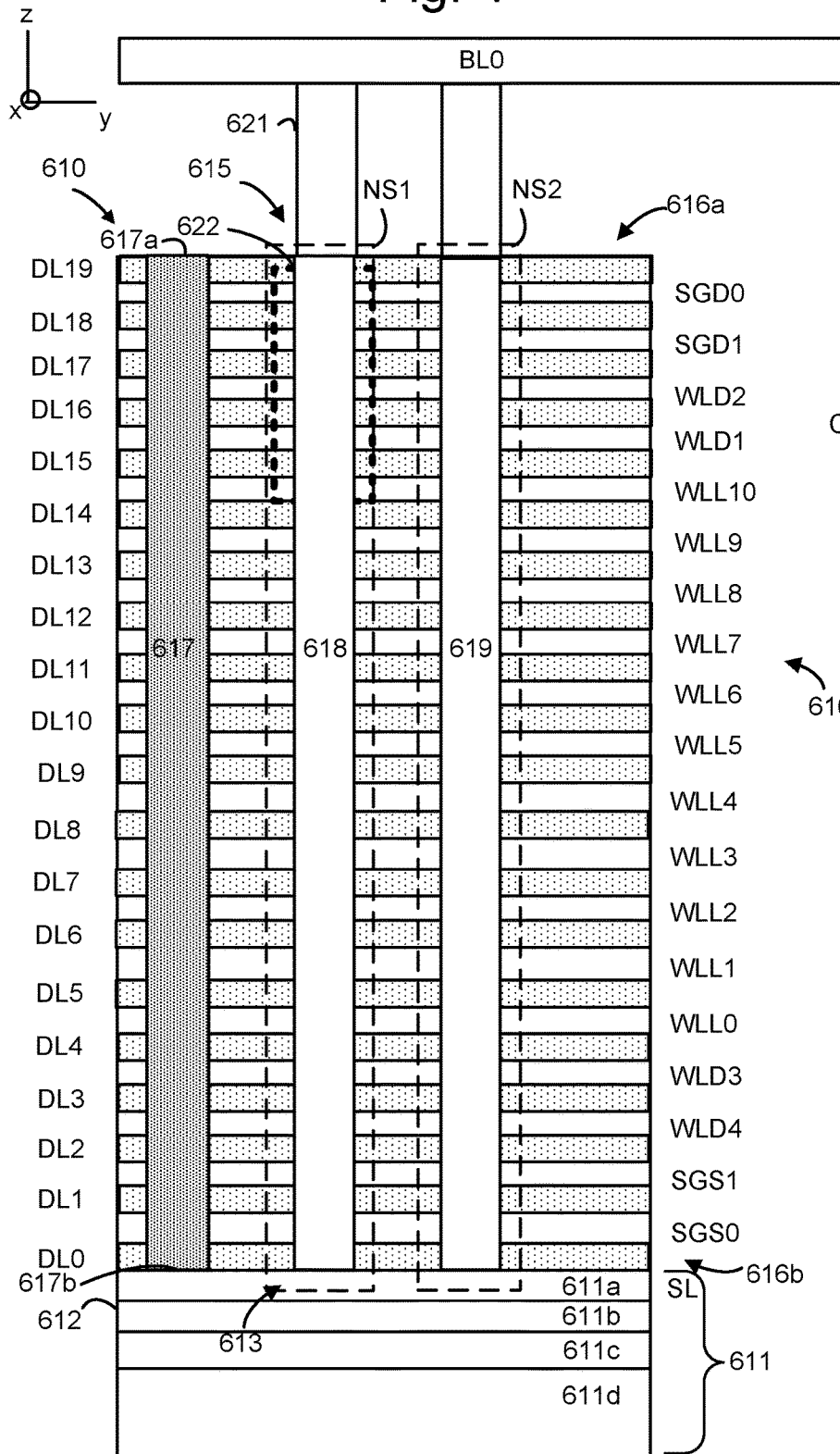
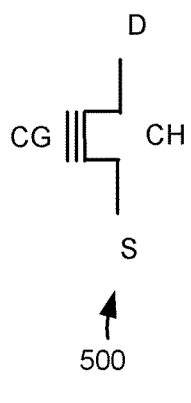
Fig. 4
Fig. 5

Fig. 16A

| Host file system table, 1511 | |
|---|---|
| File name | logical address |
| file 1, sector 0 | 0 |
| file 1, sector 1 | 1 |
| file 1, sector 2 | 2 |
| file 2, sector 0 | 3 |
| file 2, sector 1 | 4 |
| file 2, sector 2 | 5 |
| file 3, sector 0 | 6 |
| file 3, sector 1 | 7 |
| file 3, sector 2 | 8 |

Fig. 16B

| Device file system table, 1521 | | | |
|---|---|---|---|
| Logical address | One block physical address | Another block physical address | bit |
| 0 | block 3, page 0 | n/a | 1 |
| 1 | block 3, page 1 | n/a | 1 |
| 2 | block 3, page 2 | n/a | 1 |
| 3 | block 3, page 3 | n/a | 1 |
| 4 | block 3, page 4 | n/a | 1 |
| 5 | block 3, page 5 | n/a | 1 |
| 6 | block 3, page 6 | n/a | 1 |
| 7 | block 3, page 7 | n/a | 1 |
| 8 | block 3, page 8 | n/a | 1 |

Fig. 16C

| Device file system table, 1521 | | | |
|---|---|---|---|
| Logical address | One block physical address | Another block physical address | bit |
| 0 | block 3, page 0 | block 4, page 0 | 1 |
| 1 | block 3, page 1 | block 4, page 1 | 1 |
| 2 | block 3, page 2 | block 4, page 2 | 1 |
| 3 | block 3, page 3 | block 4, page 3 | 1 |
| 4 | block 3, page 4 | block 4, page 4 | 1 |
| 5 | block 3, page 5 | block 4, page 5 | 1 |
| 6 | block 3, page 6 | block 4, page 6 | 1 |
| 7 | block 3, page 7 | block 4, page 7 | 1 |
| 8 | block 3, page 8 | block 4, page 8 | 1 |

Fig. 16D

| Device file system table, 1521 | | | |
|---|---|---|---|
| Logical address | One block physical address | Another block physical address | bit |
| 0 | n/a | block 4, page 0 | 0 |
| 1 | n/a | block 4, page 1 | 0 |
| 2 | n/a | block 4, page 2 | 0 |
| 3 | n/a | block 4, page 3 | 0 |
| 4 | n/a | block 4, page 4 | 0 |
| 5 | n/a | block 4, page 5 | 0 |
| 6 | n/a | block 4, page 6 | 0 |
| 7 | n/a | block 4, page 7 | 0 |
| 8 | n/a | block 4, page 8 | 0 |

Fig. 17A

| Device file system table, 1521a | | | |
|---|---|---|---|
| Logical address | SLC physical address | MLC physical address | bit |
| 0 | block 0, page 0 | n/a | 1 |
| 1 | block 0, page 1 | n/a | 1 |
| 2 | block 0, page 2 | n/a | 1 |
| 3 | block 1, page 0 | n/a | 1 |
| 4 | block 1, page 1 | n/a | 1 |
| 5 | block 1, page 2 | n/a | 1 |
| 6 | block 2, page 0 | n/a | 1 |
| 7 | block 2, page 1 | n/a | 1 |
| 8 | block 2, page 2 | n/a | 1 |

Fig. 17B

| Device file system table, 1521a | | | |
|---|---|---|---|
| Logical address | SLC physical address | MLC physical address | bit |
| 0 | block 0, page 0 | block 3, page 0 | 1 |
| 1 | block 0, page 1 | block 3, page 1 | 1 |
| 2 | block 0, page 2 | block 3, page 2 | 1 |
| 3 | block 1, page 0 | block 3, page 3 | 1 |
| 4 | block 1, page 1 | block 3, page 4 | 1 |
| 5 | block 1, page 2 | block 3, page 5 | 1 |
| 6 | block 2, page 0 | block 3, page 6 | 1 |
| 7 | block 2, page 1 | block 3, page 7 | 1 |
| 8 | block 2, page 2 | block 3, page 8 | 1 |

Fig. 17C
| | Device file system table, 1521a | | |
|---|---|---|---|
| Logical address | SLC physical address | MLC physical address | bit |
| 0 | n/a | block 3, page 0 | 0 |
| 1 | n/a | block 3, page 1 | 0 |
| 2 | n/a | block 3, page 2 | 0 |
| 3 | n/a | block 3, page 3 | 0 |
| 4 | n/a | block 3, page 4 | 0 |
| 5 | n/a | block 3, page 5 | 0 |
| 6 | n/a | block 3, page 6 | 0 |
| 7 | n/a | block 3, page 7 | 0 |
| 8 | n/a | block 3, page 8 | 0 |
Fig. 18A
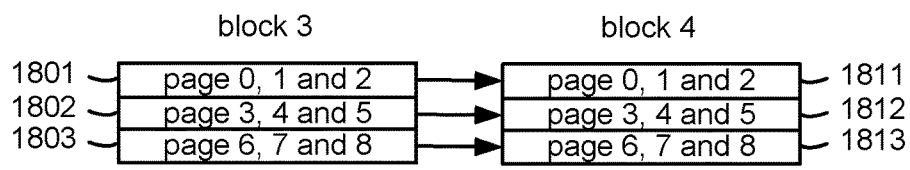
Fig. 18B
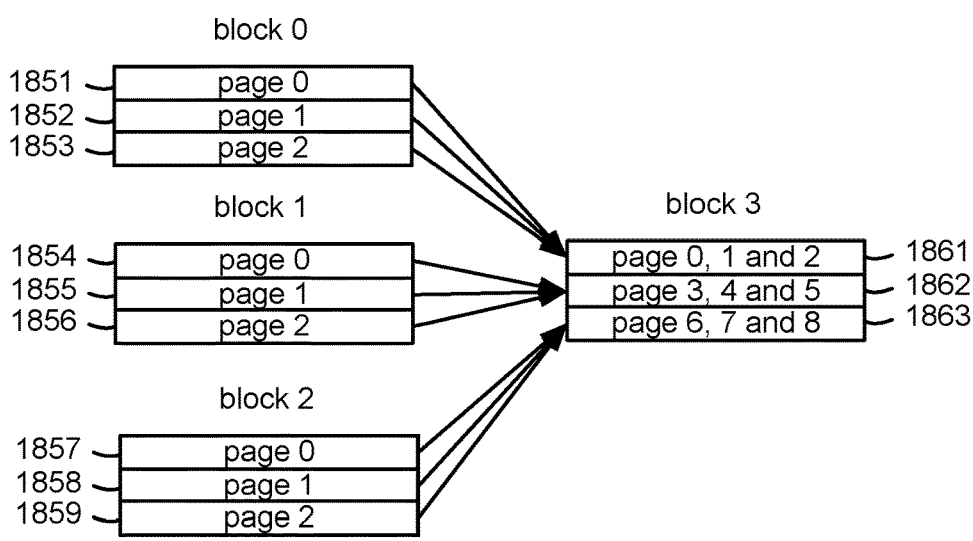

Fig. 19A

| | Device file system table, 1521b | | |
|---|---|---|---|
| Front end block address | SLC virtual block address | MLC virtual block address | bit |
| 0 | SLC_VBA0 | n/a | 1 |
| 1 | SLC_VBA1 | n/a | 1 |
| 2 | SLC_VBA2 | n/a | 1 |
| 3 | SLC_VBA3 | n/a | 1 |
| 4 | SLC_VBA4 | n/a | 1 |
| 5 | SLC_VBA5 | n/a | 1 |
| 6 | SLC_VBA6 | n/a | 1 |
| 7 | SLC_VBA7 | n/a | 1 |
| 8 | SLC_VBA8 | n/a | 1 |

Fig. 19B

| | Device file system table, 1521b | | |
|---|---|---|---|
| Front end block address | SLC virtual block address | MLC virtual block address | bit |
| 0 | SLC_VBA0 | MLC_VBA0 | 1 |
| 1 | SLC_VBA1 | MLC_VBA1 | 1 |
| 2 | SLC_VBA2 | MLC_VBA2 | 1 |
| 3 | SLC_VBA3 | MLC_VBA3 | 1 |
| 4 | SLC_VBA4 | MLC_VBA4 | 1 |
| 5 | SLC_VBA5 | MLC_VBA5 | 1 |
| 6 | SLC_VBA6 | MLC_VBA6 | 1 |
| 7 | SLC_VBA7 | MLC_VBA7 | 1 |
| 8 | SLC_VBA8 | MLC_VBA8 | 1 |

Fig. 19C

| | Device file system table, 1521b | | |
|---|---|---|---|
| Front end block address | SLC virtual block address | MLC virtual block address | bit |
| 0 | n/a | MLC_VBA0 | 0 |
| 1 | n/a | MLC_VBA1 | 0 |
| 2 | n/a | MLC_VBA2 | 0 |
| 3 | n/a | MLC_VBA3 | 0 |
| 4 | n/a | MLC_VBA4 | 0 |
| 5 | n/a | MLC_VBA5 | 0 |
| 6 | n/a | MLC_VBA6 | 0 |
| 7 | n/a | MLC_VBA7 | 0 |
| 8 | n/a | MLC_VBA8 | 0 |

Fig. 19D

Device file system table, 1521b

| SLC virtual block address | SLC physical address |
|---|---|
| SLC_VBA0 | block 0, page 0 |
| SLC_VBA1 | block 0, page 1 |
| SLC_VBA2 | block 0, page 2 |
| SLC_VBA3 | block 1, page 0 |
| SLC_VBA4 | block 1, page 1 |
| SLC_VBA5 | block 1, page 2 |
| SLC_VBA6 | block 2, page 0 |
| SLC_VBA7 | block 2, page 1 |
| SLC_VBA8 | block 2, page 2 |

Fig. 19E

Device file system table, 1521c

| MLC virtual block address | MLC physical address |
|---|---|
| MLC_VBA0 | block 3, page 0 |
| MLC_VBA1 | block 3, page 1 |
| MLC_VBA2 | block 3, page 2 |
| MLC_VBA3 | block 3, page 0 |
| MLC_VBA4 | block 3, page 1 |
| MLC_VBA5 | block 3, page 2 |
| MLC_VBA6 | block 3, page 0 |
| MLC_VBA7 | block 3, page 1 |
| MLC_VBA8 | block 3, page 2 |

DELAYED DATA RELEASE AFTER PROGRAMMING TO REDUCE READ ERRORS IN MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 4 depicts an example cross-sectional view of a portion of one of the blocks of FIG. 3.

FIG. 5 depicts an example transistor 500.

FIG. 16A depicts an example host file system table.

FIG. 16B depicts an example device file system table when data is written to one block, consistent with FIG. 14A and 16A.

FIG. 16C depicts the example device file system table of FIG. 16B when data is copied from the one block to another block.

FIG. 16D depicts the example device file system table of FIG. 16C when the data in the one block is decommitted.

FIG. 17A depicts an example device file system table when data is written to SLC blocks, consistent with FIG. 14B and 16A.

FIG. 17B depicts the example device file system table of FIG. 17A when data is copied from the SLC blocks to an MLC block.

FIG. 17C depicts the example device file system table of FIG. 17B when the data in the SLC blocks is decommitted.

FIG. 18A depicts an example of one block and another block, consistent with FIG. 14A and 16B to 16D.

FIG. 18B depicts an example of SLC blocks and an MLC block, consistent with FIG. 14B and 17A to 17C.

FIG. 19A depicts another example device file system table when data is written to SLC blocks, consistent with FIG. 14A and 16A, and virtual blocks are used.

FIG. 19B depicts the example device file system table of FIG. 19A when data is copied from the SLC blocks to an MLC block.

FIG. 19C depicts the example device file system table of FIG. 19B when the data in the SLC blocks is decommitted.

FIG. 19D depicts an example device file system table which shows a mapping from SLC virtual block addresses to SLC physical addresses, consistent with FIG. 19A to 19C.

FIG. 19E depicts an example device file system table which shows a mapping from MLC virtual block addresses to MLC physical addresses, consistent with FIG. 19A to 19C.

DETAILED DESCRIPTION

Figure 1A:
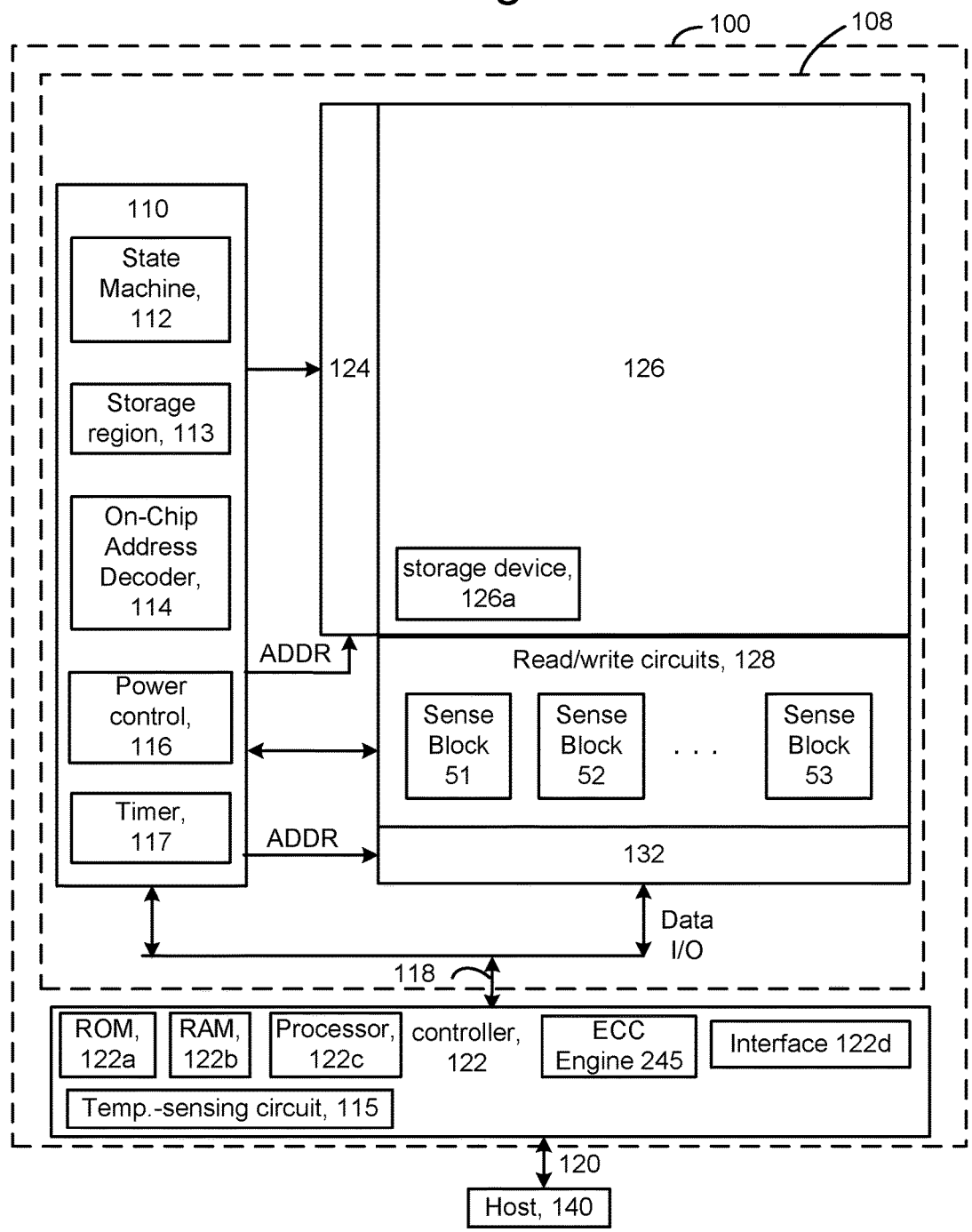
FIG. 1A is a block diagram of an example memory device.

Apparatuses and techniques are described for reducing read errors in a memory device including, in particular, errors due to detrapping of charges from memory cells.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

When data is programmed into a block, the threshold voltages (Vth) of the memory cells are increased to different levels which represent different data states. However, the Vth can downshift after programming due to phenomenon such as detrapping. Moreover, the time period over which the detrapping occurs can vary based on factors such as temperature. In some cases, the detrapping occurs over a period of a few milliseconds. If all or most of the detrapping has occurred, the memory cells will be in a stable state where they can be accurately read. However, performance is impacted if a delay is imposed before the cell can be read.

Techniques provided herein address the above and other issues. In one aspect, a timer is started after a programming operation for a block has been completed. If a read command is received before the timer has expired, the read operation proceeds but with adjustments to the read voltages. If the read command is received after the timer has expired, the read operation proceeds with nominal read voltages.

In another aspect, a discharge event is performed for the cells after programming to accelerate the detrapping. If a read command is received, the read operation proceeds but with adjustments to the read voltages.

In another aspect, data is copied from one block to another block and a timer is started after the copying is completed. If a read command is received before the timer has expired, the read operation proceeds by reading the one block. If the read command is received after the timer has expired, the read operation proceeds by reading the another block. This approach is particular suitable when data is copied from SLC blocks to MLC blocks.

The techniques maintain device performance, e.g., by avoiding an increase in the read time. The techniques also avoid an increase in read errors when a read operation follows a program operation very quickly, e.g., within a few milliseconds.

These and other features are discussed herein.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates.

The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, storage region 113, an on-chip address decoder 114 a power control module 116 and a timer 117. The state machine 112 provides chip-level control of memory operations. The storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string. The timer can be used to track an elapsed time since a programming or read operation has completed. For example, the timer may track the elapsed time since programming of a block is completed. The timer may count for a specified period of time. At the conclusion of the period, the timer expires. The elapsed time may be a function of temperature.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, timer 117, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

The controller 122 may also include a temperature-sensing circuit 115 which is used by the processor 122c to set temperature-based parameters such as the elapsed time of the timer, or a shift in a read voltage. For example, the controller may provide a digital signal to the power control module 116 to set a read voltage in response to a temperature indicated by an output of the temperature-compensation circuit. See also FIG. 1B.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
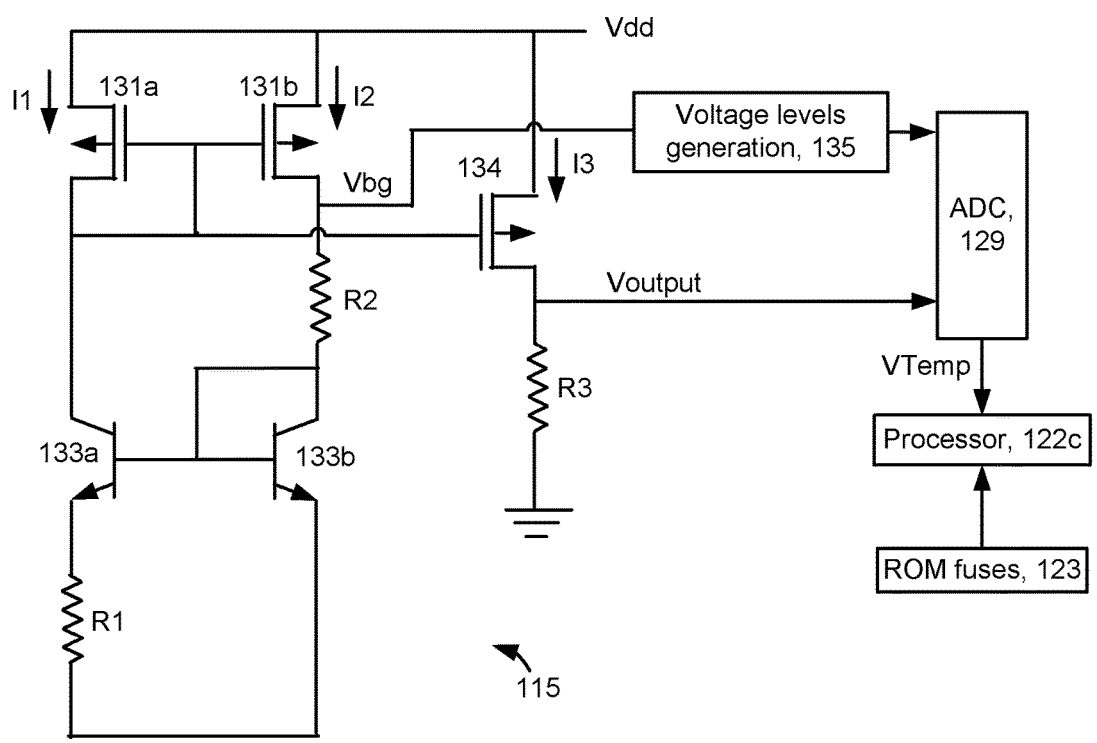
FIG. 1B depicts an example of the temperature-sensing circuit 115 of FIG. 1B.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
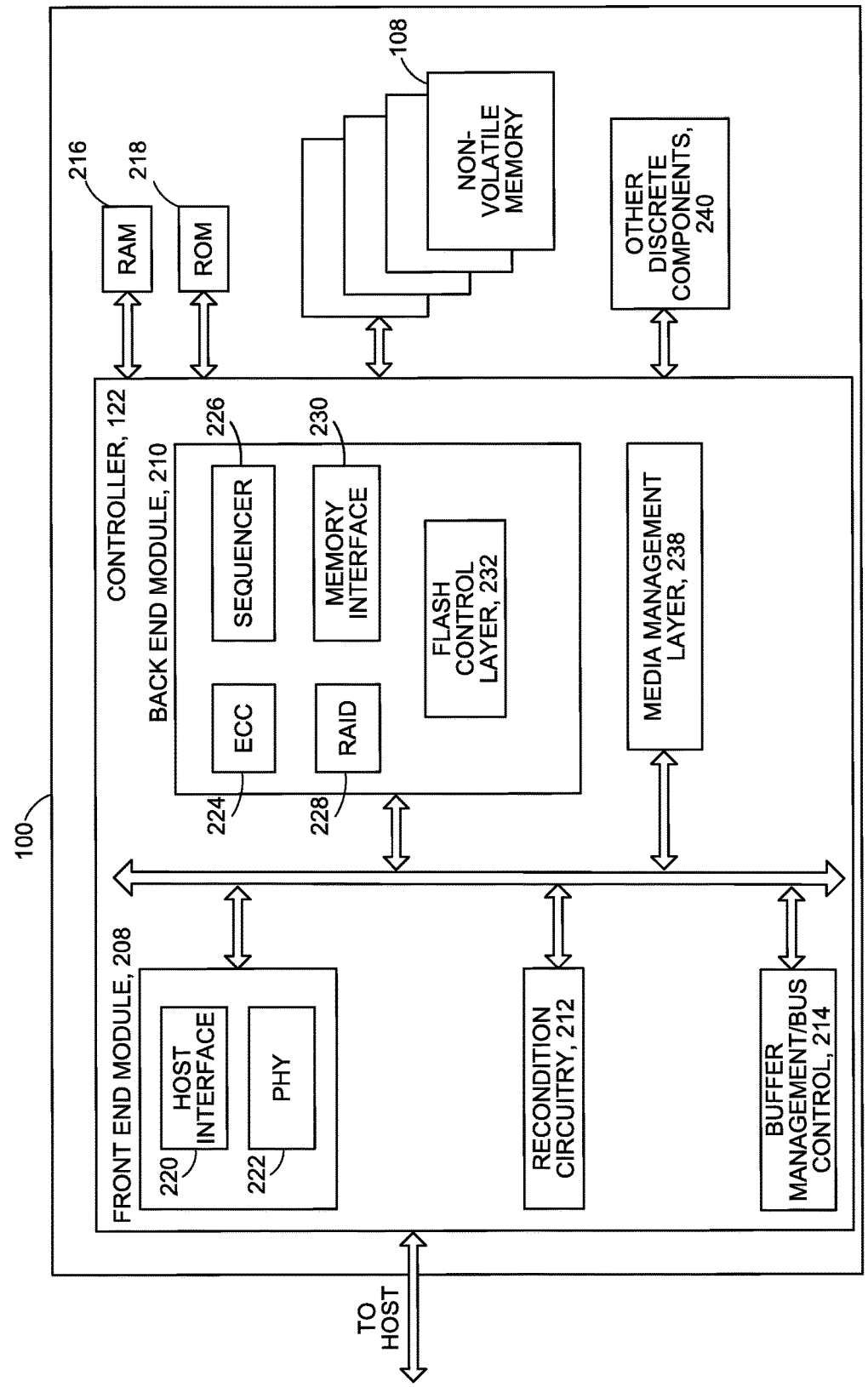
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The FTL may implement the file system tables discussed further below. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
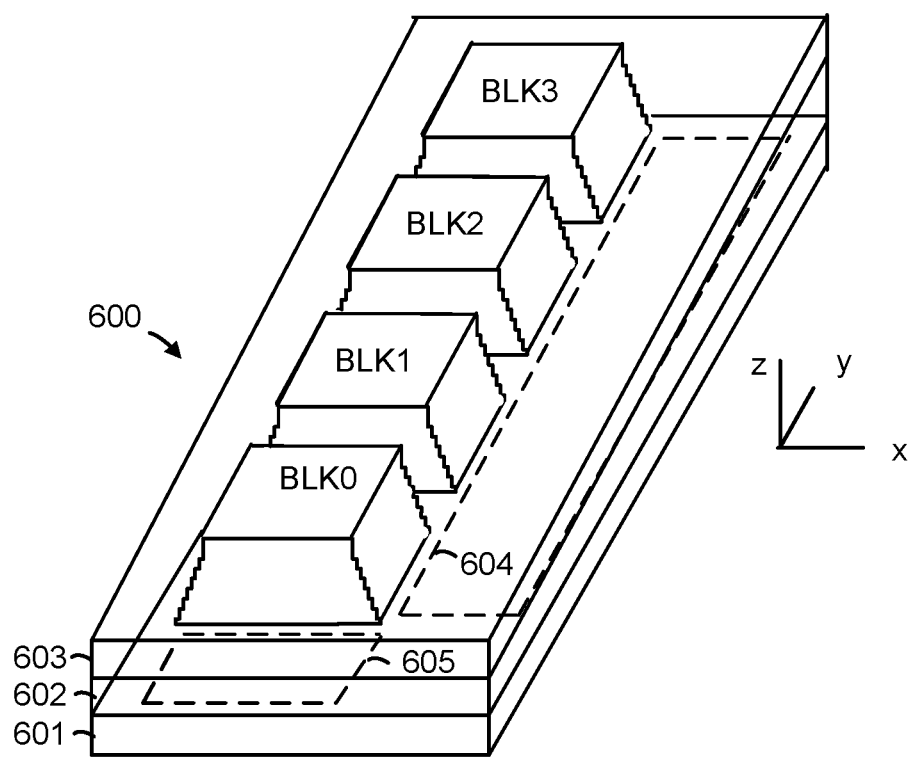
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks.

The circuitry can include voltage drivers which can be connected to control gate layers, bit lines and source lines of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Local interconnects, such as interconnect 617, may be provided periodically across the stack. The local interconnects may be metal-filled slits which extend through the stack, such as to connect the source line/substrate to a line above the stack. The slits may be used during the formation of the word lines and subsequently filled with metal. A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is in contact with the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

FIG. 5 depicts an example transistor 500. The transistor comprises a control gate CG, a drain D, a source S and a channel CH. During an erase operation, the transistor has a positive channel-to-control gate voltage. In the case of a memory cell transistor, the control gate voltage can be set to a low value such as 0 V so that the channel-to-control gate voltage is high enough to repel electrons from the charge trapping layer and thereby lower the Vth of the memory cell. In the case of a select gate transistor, the control gate voltage can be set to a higher value such as 10-12 V or floated so that the channel-to-control gate voltage is not high enough to lower the Vth of the transistor.

Figure 6:
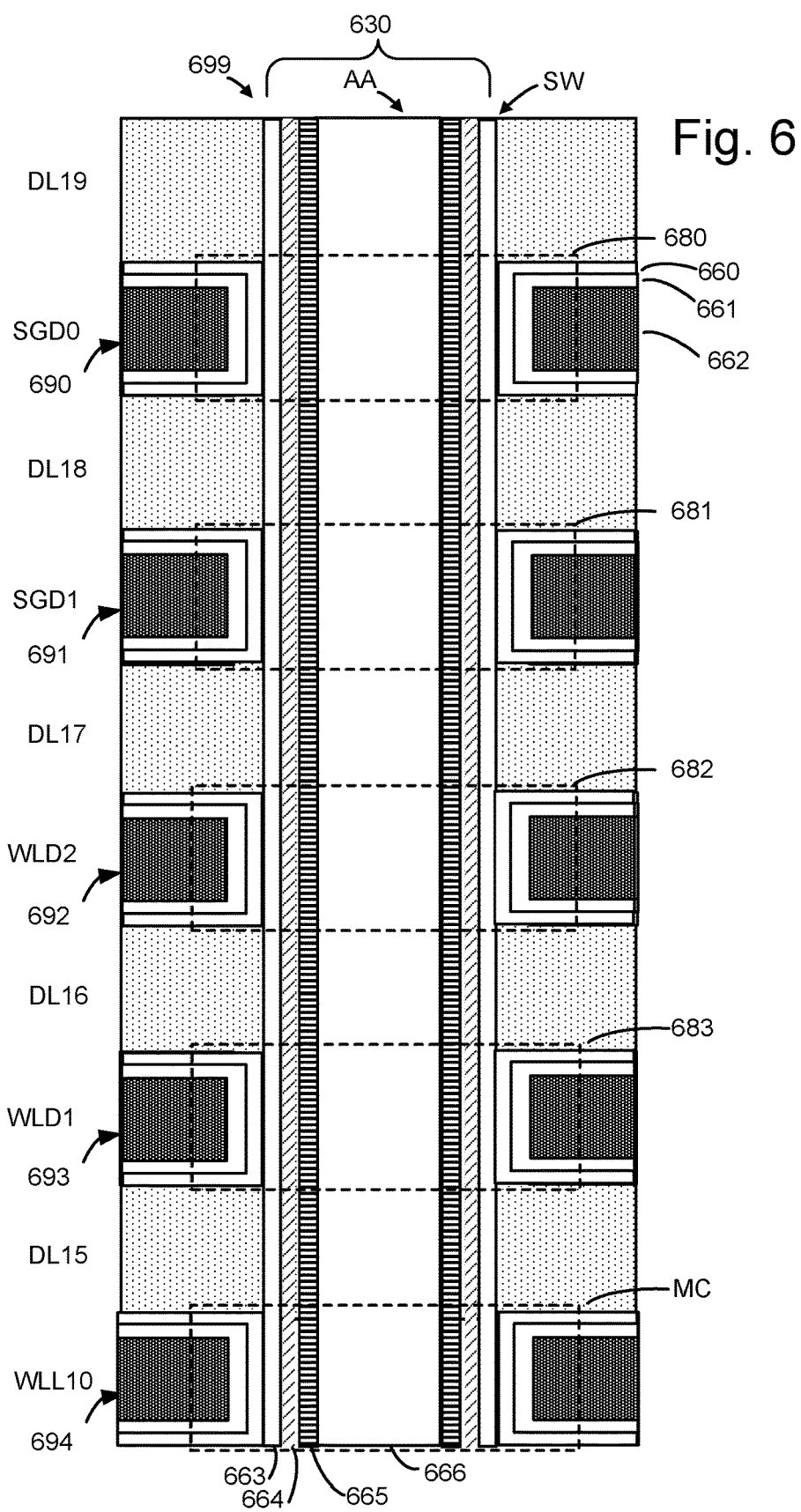
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664 (such as oxide, to provide a tunnel oxide), a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
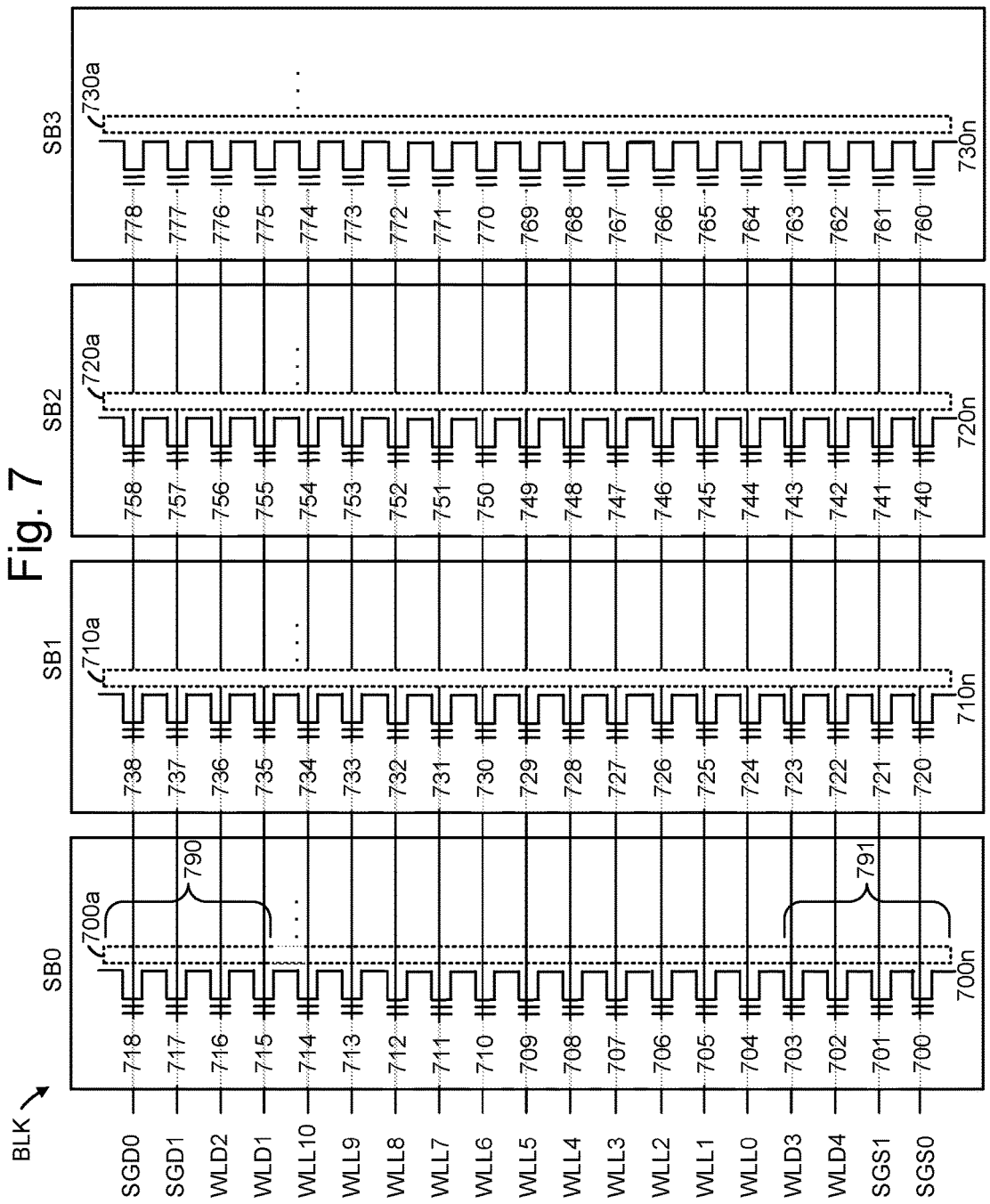
FIG. 7 depicts an example view of NAND strings in sub-blocks in a 3D configuration which is consistent with FIG. 4.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively. Each channel has a drain end and a source end. For example, the channel 700a has a drain end 790 and a source end 791.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 8:
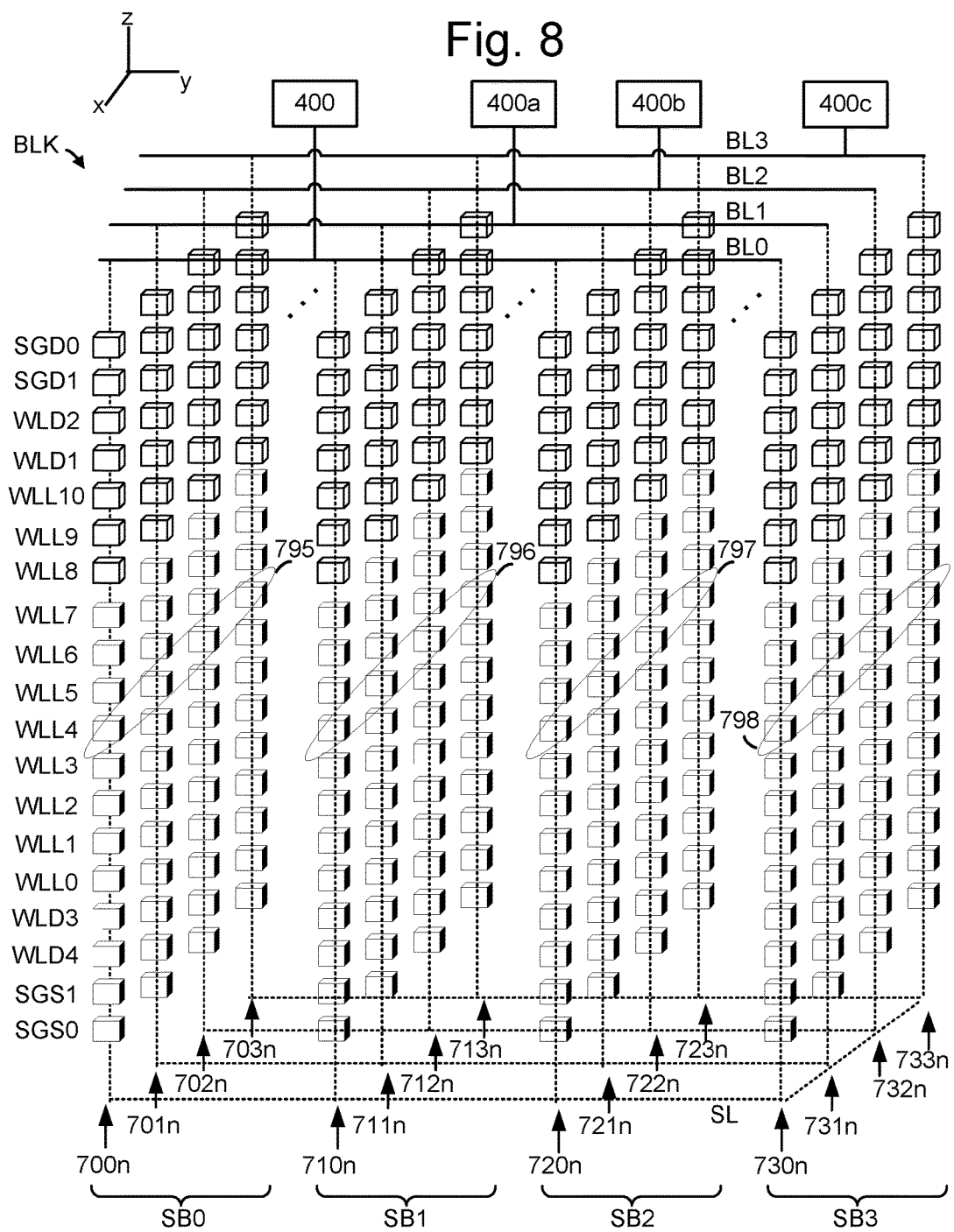
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits 400, 400a, 400b and 400c are connected to the bit lines BL0, BL1, BL2 and BL3, respectively.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4.

Figure 9:
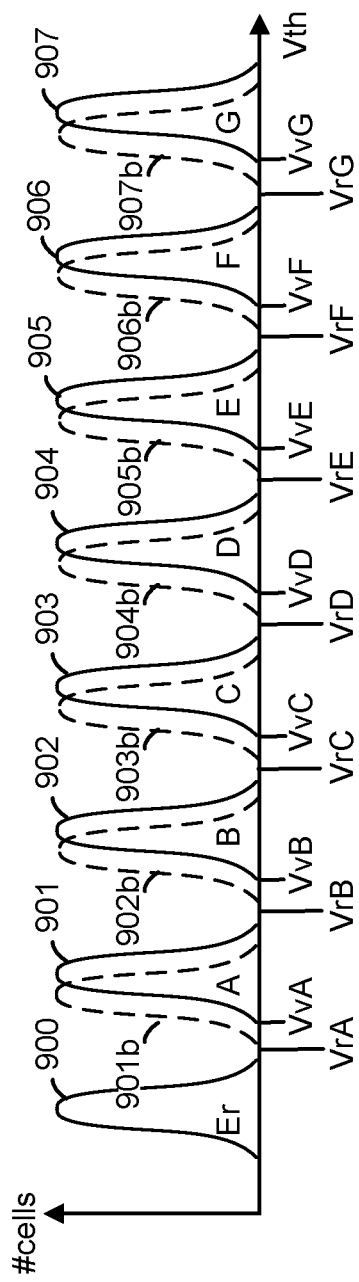
FIG. 9 depicts an example Vth distribution of memory cells, where eight data states are used, showing the effects of detrapping.

FIG. 9 depicts an example Vth distribution of memory cells, where eight data states are used, showing the effects of detrapping. Detrapping results in a downshift in the Vth of the programmed states. The amount of the downshift may be similar for the different states. The detrapping results in the Vth distributions 901, 902, 903, 904, 905, 906 and 907 which are achieved at the completion of programming, transitioning to the Vth distributions 901b, 902b, 903b, 904b, 905b, 906b and 907b for the A, B, C, D, E, F and G states, respectively. The Vth distribution 900 represents the erased state.

Figure 10:
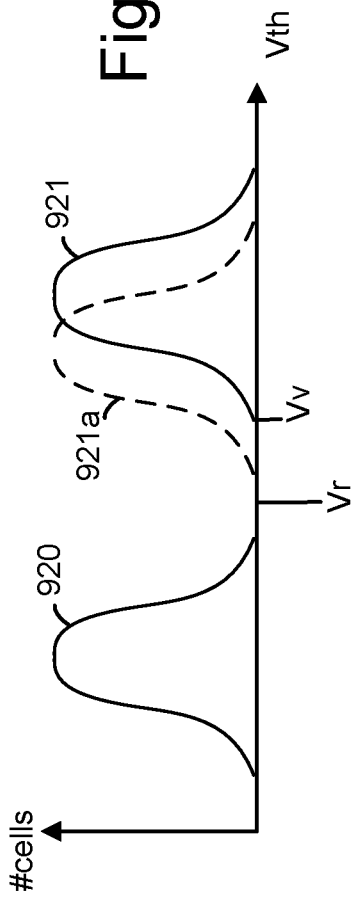
FIG. 10 depicts an example Vth distribution of memory cells, where two data states are used, showing the effects of detrapping.

FIG. 10 depicts an example Vth distribution of memory cells, where two data states are used, showing the effects of detrapping. An erased state Vth distribution 920 and a programmed state Vth distribution 921 are depicted. The verify voltage is Vv and the read voltage is Vr. The Vth distribution 921*a* represents the programmed state cells after detrapping.

Figure 11A:
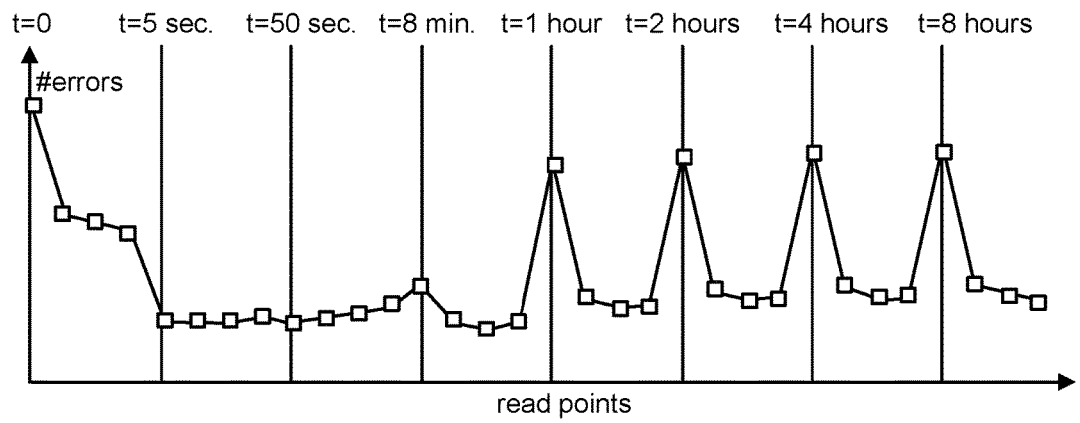
FIG. 11A depicts a plot of errors versus read points at different times after a programming operation, showing the effects of detrapping in memory cells.

FIG. 11A depicts a plot of errors versus read points at different times after a programming operation, showing the effects of detrapping in memory cells. Each square represents a read operation. When the programming of a complete block or portion of a block is completed and a read operation is subsequently performed, the error count is initially very high if the read levels are set assuming that the detrapping and associated Vth downshift has already occurred. In this example, the time scale over which the read operations occur is non-linear. The read operations occur at time points of t=0, 5sec., 50 sec., 8 min., 1 hour, 2 hours, 4 hours and 8 hours after programming is completed. At each time point, four read operations are performed at 100 msec. intervals.

It can be seen that the number of errors drops quickly and reaches a minimum level until the read at t=1 hour. At this time, the cells have transitioned from a second read situation to a first read situation. Assuming the read voltages are optimized for the detrapped state and the second read situation, a spike in the error count occurs. Subsequent reads at the 100 msec. interval are soon enough that the cells remain in the second read situation and the error count drops again. This pattern is repeated with a spike in the error count at 2 hours, 4 hours and 8 hours after programming. These spikes are due to the cells transitioning from the second read situation to the first read situation. Appropriate countermeasures can be taken for this issue including adjusting of the read voltages and applying a dummy read voltage before a read operation which occurs after a long period with no program or read operation. The first read issue occurs over a longer time frame than the detrapping issue and involves a separate mechanism.

The peak error count near t=0 may be unacceptable if it results in uncorrectable read errors.

The "first read" situation can be defined in which the word lines are not coupled up, and a "second read" situation can be defined in which the word lines are coupled up. The memory cells can be in the first read situation after a significant amount of time has passed after a last program or read operation, since the word lines discharge over time. The cells can be in the second read situation when the read occurs shortly, e.g., seconds or minutes, after a last sensing operation. Since the word lines are relatively strongly coupled up while in the second read situation, there is a programming or erasing of the cells due to the word line voltage, and a corresponding shift in the Vth. In particular, the word lines with a coupled-up voltage can cause weak programming of cells which have a relatively low Vth, lower than the coupled-up voltage, e.g., cells in lower programmed data states, thus resulting in a Vth upshift for these cells. Also, there can be a weak erasing of cells which have a relatively high Vth, higher than the coupled-up voltage, e.g., cells in higher programmed data states, thus resulting in a Vth downshift for these cells.

The cells gradually transition from the second read situation to the first read situation over time, e.g., one hour, as the word lines are discharged.

The coupling up of the word line voltage is caused by the voltages of a sensing operation such as a verify operation which occurs in connection with a programming operation, or a read operation which occurs after a programming operation is completed. The sensing of the cells involves the application of a sensing voltage (e.g., a read/verify voltage) to a selected word line. At the same time, a read pass voltage is applied to the unselected word lines and then stepped down. This step down temporarily reduces a channel voltage due to capacitive coupling. When the channel voltage increases back to its nominal level, this causes an increase or coupling up of the word line voltages, also due to capacitive coupling. For cells in the lower data states, the Vth gradually decreases as electrons which are trapped in the charge trapping material of the cells are de-trapped and return to the channel. For cells in the higher data states, the Vth gradually increases as electrons are removed from the channel.

Figure 11B:
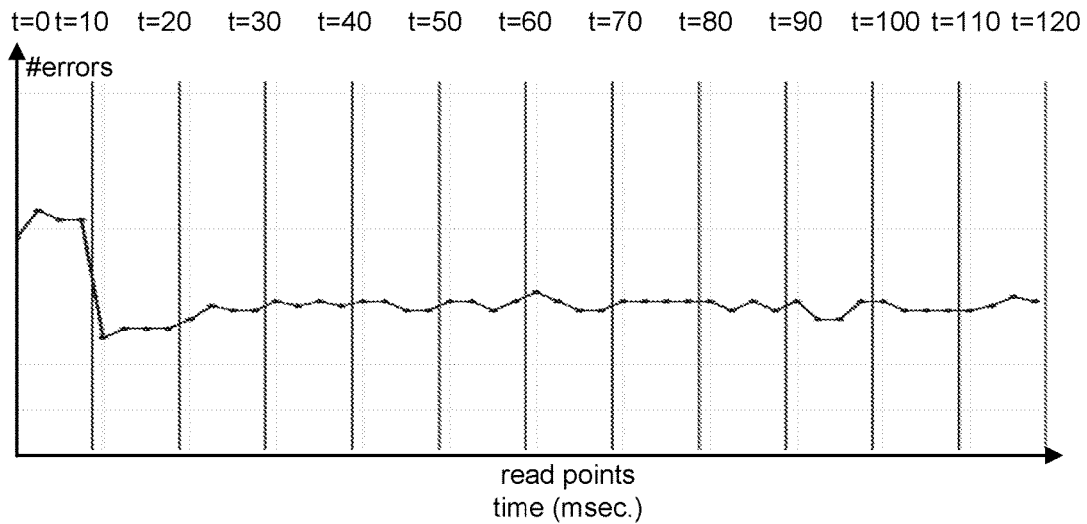
FIG. 11B depicts a plot of errors versus read points at different times after a programming operation, showing the effects of detrapping in memory cells, where the time frame depicted is smaller than in FIG. 11A.

FIG. 11B depicts a plot of errors versus read points at different times after a programming operation, showing the effects of detrapping in memory cells, where the time frame depicted is smaller than in FIG. 11A. The time axis extends from 0-120 msec. and is linear. This plot shows that the error count drops sharply at about t=10 msec. The data is obtained at room temperature. The time period at which the error count drops sharply is the detrapping period, also referred to as the short term data retention (STDR) period. After the time period, the Vth of the cells is at an equilibrium level.

Figure 11C:
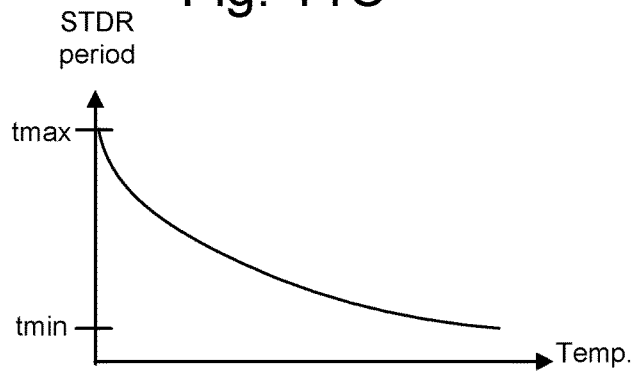
FIG. 11C depicts a plot of short term data retention period versus temperature.

FIG. 11C depicts a plot of short term data retention (STDR) period versus temperature. This period varies significantly with temperature. As an example, the STDR period is 1 msec., 10msec. or 100 msec. at high temperature (e.g., >25-30 C., up to 85 C.), room temperature (e.g., 25-30 C.) or low temperature (e.g., <25 C.), respectively. In one approach, a temperature-sensing circuit provides an indication of a temperature, and a duration of a timer increases when the temperature decreases, where the time counts down the STDR period.

Figure 12A:
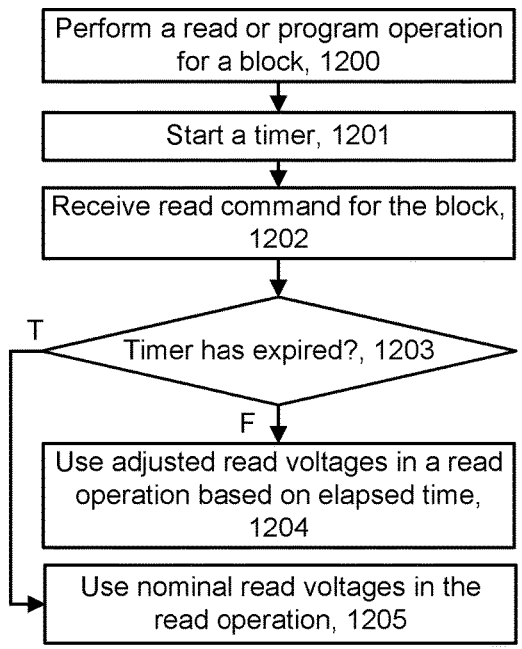
FIG. 12A depicts an example process for performing a read operation which accounts for detrapping of memory cells by using adjusted read voltages.

FIG. 12A depicts an example process for performing a read operation which accounts for detrapping of memory cells by using adjusted read voltages. Step 1200 includes performing a read or programming operation, e.g., involving memory cells of one or more word lines in a block. Step 1201 includes starting a timer. The timer is started in response to the completion of the read or programming operation. Step 1202 includes receiving a read command for the block. Decision step 1203 determines if the timer has expired, e.g., whether a specified elapsed time period has passed since the timer was started. For example, this can be a time period in which detrapping occurs in the memory cells. The time period can be as small as 10-20 msec, for instance, or longer, e.g., up to 2-5 seconds, for instance. The time period is a period in which the threshold voltages of the cells reach predictable equilibrium levels.

Figure 12B:
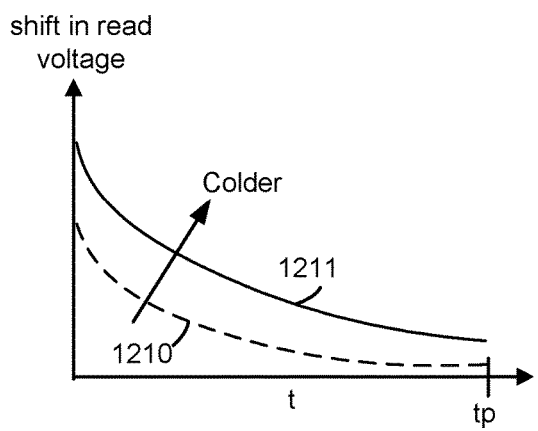
FIG. 12B depicts a plot of a shift in an example read voltage based on an elapsed time since a last programming or read operation, and also based on ambient temperature of the memory device, where a timer period tp consistent with FIG. 12A is fixed.

If decision step 1203 is true, step 1205 involves using nominal read voltages in the read operation, such as the non-shifted read voltages VrA, VrB, VrC, VrD, VrE, VrF and VrG in FIG. 9. If decision step 1203 is false, step 1204 uses adjusted read voltages in a read operation based on the elapsed time. For example, FIG. 12B shows that a shift in the read voltages can be a decreasing function of the elapsed time since the last read or programming operation in the block. If the nominal read voltages are set assuming that all or most of the detrapping has occurred, the shift will be positive if only some of the detrapping has occurred.

FIG. 12B depicts a plot of a shift in an example read voltage based on an elapsed time since a last programming or read operation, and also based on ambient temperature of the memory device, where a timer period tp consistent with FIG. 12A is fixed. At a higher temperature such as between 25-85 C., plot 1210 shows that a relatively smaller shift in the read voltages is applied. At a lower temperature such as below 25 C., plot 1211 shows that a larger magnitude shift is applied. A higher or lower temperature is a temperature above or below, respectively, a threshold.

In one approach, a common shift may be applied to each read voltage. In another approach, different shifts are applied for different read voltages. The optimum shift can be determined from testing. At a time tp, representing the end of STDR loss period, the shift is zero or close to zero. tp represents the time period in which all or most of the shift in Vth occurs for the memory cells due to detrapping. The Vth reaches an equilibrium level at this time.

In some cases tp is about 10 msec. Also, the data retention loss is non-linear such that the Vth decreases quickly at first and then more slowly. Accordingly, the shift is initially larger and then becomes smaller at a non-linear rate. In one example, the shift is 100, 50, 25 or 0 mV at 0-0.1, 0.1-1, 1-10 and above 10 msec., respectfully, for temperatures above 25 C., or 150, 75, 45 or 5 mV at 0-0.1, 0.1-1, 1-10 and above 10 msec., respectfully, for temperatures below 25 C. This approach allows a fixed tp to be used while adjusting the read voltage shift based on temperature.

Figure 12C:
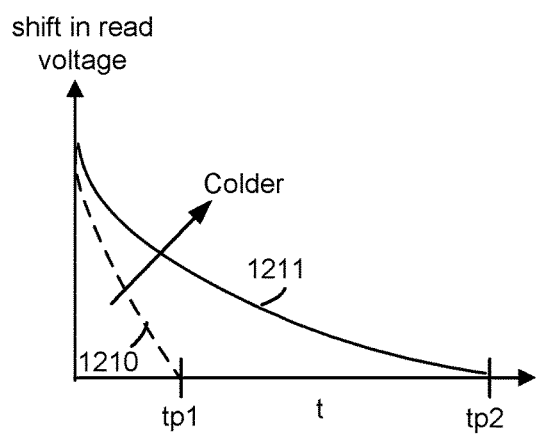
FIG. 12C depicts another example plot of a shift in an example read voltage based on an elapsed time since a last programming or read operation, and also based on ambient temperature of the memory device, where a timer period tp consistent with FIG. 12A varies with the temperature.

FIG. 12C depicts another example plot of a shift in an example read voltage based on an elapsed time since a last programming or read operation, and also based on ambient temperature of the memory device, where a timer period tp consistent with FIG. 12A varies with the temperature. In this case, the timer duration can be modified to be longer when the temperature is colder. The shift voltage is then determined based on the corresponding plot. At a higher temperature, plot 1210 shows that a relatively smaller time period (tp1) is used. At a lower temperature, plot 1211 shows that a relatively longer time period (tp2) is used.

Figure 13:
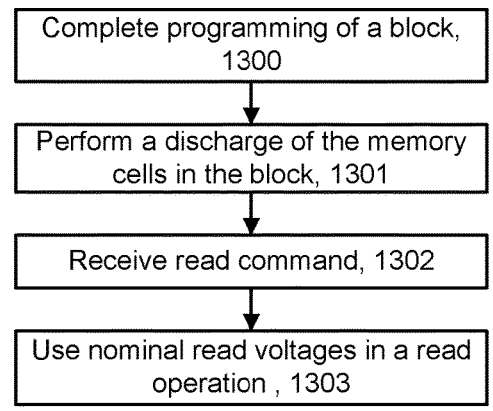
FIG. 13 depicts an example process for performing a read operation which accelerates detrapping of memory cells.

FIG. 13 depicts an example process for performing a read operation which accelerates detrapping of memory cells. Step 1300 involves completing the programming of a block. Typically, a block is programmed one word line at a time so that programming of the block is completed when programming of the last word line in the block is completed. Step 1301 involves performing a discharge of the memory cells in the block. This discharge accelerates the detrapping. For example, a light erase pulse can be applied to the block. One approach applies a small negative voltage such as 1-2 V to the word lines, without charging up the channel voltage. For example, the channel may be cutoff by providing the SGD and SGS transistors in a non-conductive state. The small negative voltage draws some electrons out of the tunnel oxide so that the Vth shift occurs significantly more quickly than when the word line voltages are at a nominal level such as 0 V or floating. By performing the discharge for the entire block, the Vth level of the cells of each word line quickly reach equilibrium levels.

Step 1302 involves receiving a read command, e.g., involving a selected word line in the block. Step 1303 involve using nominal read voltages in a read operation. This approach can avoid the need to determine a shift in the read voltage as a function of time, as in FIG. 12B.

Figure 14A:
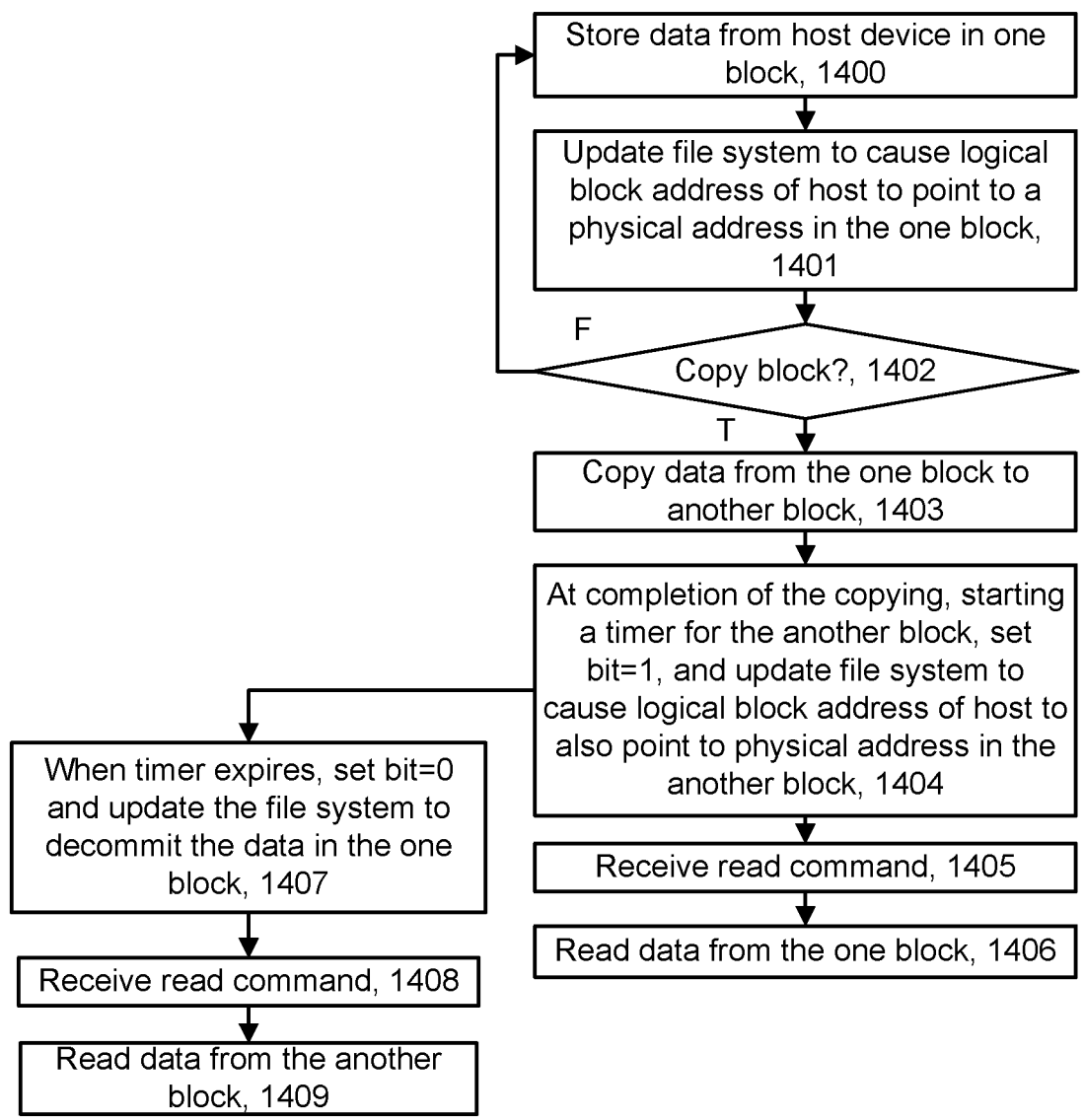
FIG. 14A depicts an example process for performing a read operation which accounts for detrapping of memory cells by waiting to read a block to which data is copied.

FIG. 14A depicts an example process for performing a read operation which accounts for detrapping of memory cells by waiting to read a block to which data is copied. Data can copied between blocks for various reasons in a memory device, such as performing compaction and reducing fragmentation. A compaction process involves identifying a selected block containing both valid data and invalid data, copying the valid data to another block and erasing the selected memory blocks. Reducing fragmentation involves moving data such as from a file from non-consecutive locations such as word lines or blocks to consecutive locations. Another example is a folding operation in which SLC blocks are copied to an MLC block, as discussed in connection with FIG. 14B.

Step 1400 includes storing data which is received from a host device in one block of the memory device. This involves programming memory cells of one or more word lines of the one block. Step 1401 includes updating a file system to cause a logical block addresses of the host to point to a physical address in the one block (a first location). See, e.g., FIG. 16B. Decision step 1402 determines if a command has been issued to copy the data of the one block to another block (a second location). For example, this command can be issued by the controller 122 or circuitry 110 within the memory device (FIG. 1A). The copying can be of various types including copying one block to another block, copying multiple blocks to one block, and copying one block to multiple blocks. Also, the number of bits per cell can be different in the blocks involved in the copying. For example, one or more blocks with one bit per cell can be copied to a block with multiple bits per cell. Also, a block with N bits per cell can be copied to a block with M bits per cell, where M>1, N>1 and M≠N. Also, the blocks involved in the copying can have the same number of bits per cell, where the number is one or more bits per cell.

If decision step 1402 is false, the process returns to step 1400 to wait to receive additional data to store in the same block or an additional block. If decision step 1402 is true, step 1403 includes copying data from the one block to another block. This involves reading memory cells of one or more word lines of the one block and programming the read data into memory cells of one or more word lines of the another block.

Optionally, a control circuit may be configured to evaluate a portion of the page in the one block using an error correction code and confirm that no uncorrectable errors exist in the portion of the page in the one block before starting the copying.

At step 1404, at the completion of the copying, e.g., the completion of the programming of the data into the another block, a timer is started for the another block, a bit is set to "1," and the file system is updated to cause the logical block address of the host to also point to the another block. See, e.g., FIG. 16C. The timer may count to a specified time period tp as in FIG. 12B or 12C.

Subsequently, a read command may be received for the data before or after expiration of the timer. The read command could be from the host device, for example. At step 1407, the timer expires, bit=0 is set and the file system is updated to decommit the data in the one block. Decommitting of data means making the data no longer available by removing a reference to it in the memory device's file system. The decommitting is thus delayed until the timer expires. The decommitting could otherwise occur as soon as the copying is completed. See, e.g., FIG. 16D. A read command for the data is received at step 1408 and the data is read from the another block at step 1409. At step 1405, a read command involving the data is received before the expiration of the timer so that the bit is still "1" and the data is read from the one block at step 1406.

Thus, the file system of the memory device cross references the logical address of data to two block addresses (first and second locations) in the memory device for a brief period which corresponds to the short term data loss period tp. This allows the data to be read from either location. By delaying the release of the data from the second location until the short term data loss period has elapsed, we ensure that when the data is read from the second location, the Vth is at the equilibrium level. As a result, the nominal read voltages can be used and a low error rate is achieved. If the data is to be read before the short term data loss period has elapsed for the second location, the data can be read from the first location instead.

Another option is to start another timer after completing programming at the first location, e.g., after step 1400 is completed. This allows us to detect if the read is requested before the short term data loss period has elapsed for the first location. In this case, various options are possible. For example, the reading of the data from the first location can be delayed until the period has elapsed. Or, the read can occur without delay but the read voltages can be shifted based on the amount of time which has elapsed for the first location, as in FIG. 12B.

The read operations at steps 1406 and 1409 can use the nominal read voltages assuming the memory cells are in the equilibrium state.

The above process provides the memory device with a time margin which allows the device to avoid reading data at a time in which a high number of read errors is likely. This helps avoid uncorrectable read errors when a host issues a read command in the several milliseconds after a program operation. The process can be implemented in a firmware control table, for instance.

A related method includes starting copying of a page of data from one block to another block at a time when a file system comprises a logical block address which points to a physical page address of the page in the one block; starting a timer in response to completion of the copying; receiving a request to read the page after the starting of the time; in response the request, determining whether the timer has expired; and if the timer has not yet expired, reading the page from the one block. The method further includes starting the copying of the page from the one block to the another block along with copying of an additional page of an additional block to the another block when the one block and the additional block become full.

For example, in FIG. 18A, the one block can be block 3 and the another block can be block 4. The pages can be any of pages 0-8. In FIG. 18B, the one block can be any of blocks 0-2 and the another block can be block 3. The pages can be any of pages 0-2 in blocks 0-2 or pages 0-8 in block 3.

Figure 14B:
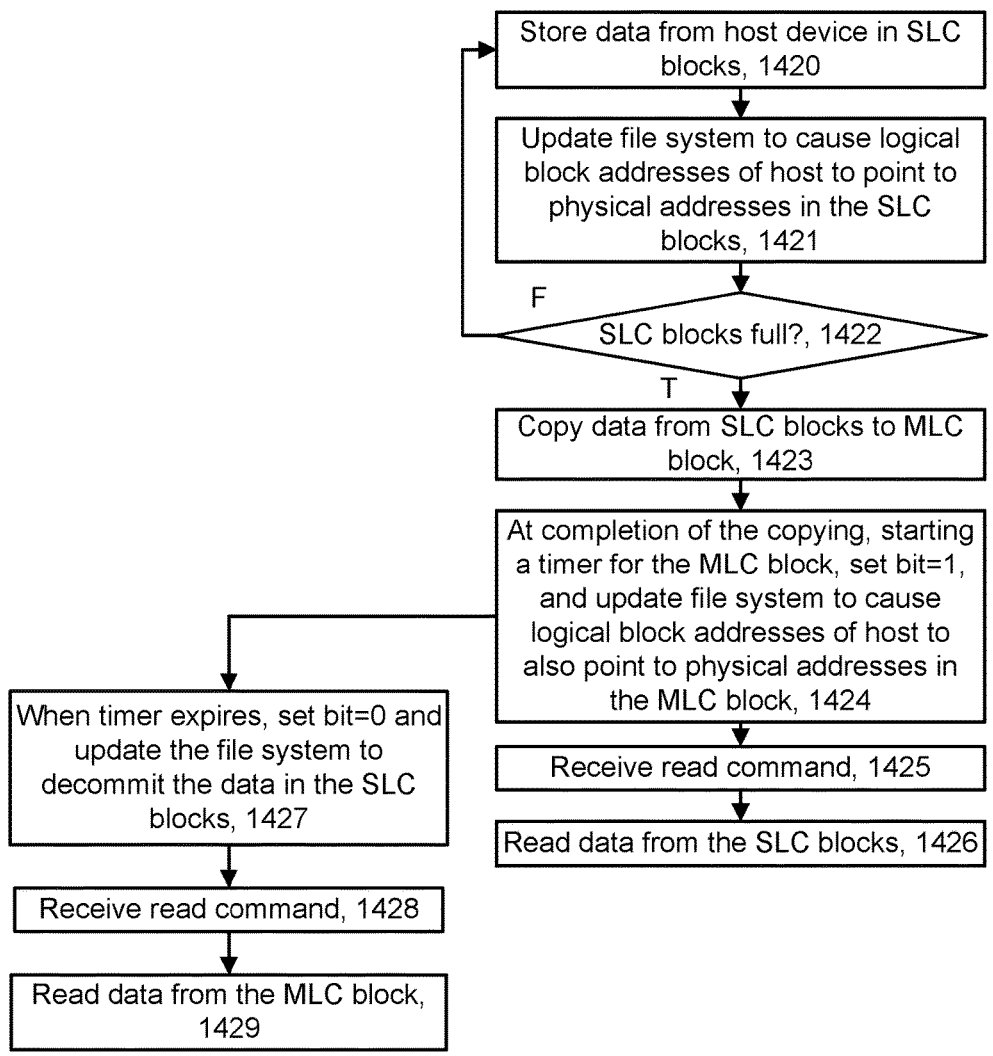
FIG. 14B depicts an example process for performing a read operation which accounts for detrapping of memory cells by waiting to read a multi-level cell (MLC) block to which data is copied from single-level cell (SLC) blocks.

FIG. 14B depicts an example process for performing a read operation which accounts for detrapping of memory cells by waiting to read a multi-level cell (MLC) block to which data is copied from single-level cell (SLC) blocks. As mentioned, data can copied between blocks in a folding operation in which SLC blocks are copied to an MLC block. An SLC block comprises memory cells which store one bit of data and an MLC block comprises memory cells which store two or more bits of data. In the example of FIG. 9, there are eight data states and three bits per cell.

It is desirable to store data which is received from a host in SLC block because the data can be written more quickly to these blocks. This allows for a high speed data transfer from the host such as in a burst mode. After the data is stored in one or more SLC blocks, it can be transferred to one or more MLC block. Typically, the data of multiple SLC blocks is transferred to one MLC block.

By implementing a timer based on the completion of the copying of the data to the MLC block, the memory device can determine whether a read to a particular logical block address (LBA) is within a specified time period (tp). If it is within this time period, the read should be performed from the SLC blocks. If it is after this time period, the FTL modifies the file system to point the LBA to the MLC block.

Step 1420 includes storing data which is received from a host device in SLC blocks of the memory device. This involves programming memory cells of one or more word lines of the SLC blocks. In one approach, the data is stored in one SLC block until it become full and then in a next SLC block and so forth. Step 1421 includes updating a file system to cause logical block addresses of the host to point to the SLC blocks. See, e.g., FIG. 17A. Decision step 1422 determines if the SLC blocks are full. This may involve determining if a set of SLC blocks is full, where this set contains data which can be copied to one MLC block. For example, this determination can be made by the controller 122 or circuitry 110 within the memory device (FIG. 1A).

If decision step 1422 is false, the process returns to step 1420 to wait to receive additional data to store in the SLC blocks. If decision step 1422 is true, step 1423 includes copying data from the SLC blocks to an MLC block. This involves reading memory cells of the SLC blocks and programming the read data into memory cells of the MLC block. Moreover, a page which is read from an SLC block can be stored as a lower, middle or upper page in the MLC block, assuming three bit cells are used in the MLC block. In one approach, data from three word lines of an SLC block is stored in one word line of an MLC block. This can be one physical word lines or one virtual word line which comprises multiple physical word lines. At step 1424, at the completion of the copying, a timer is started for the MLC block, a bit is set to "1," and the file system is updated to cause the logical block address of the host to also point to the another block. See, e.g., FIG. 17B. The timer may count to a specified time period tp.

Subsequently, a read command may be received for the data before or after expiration of the timer. At step 1427, the timer expires, bit=0 is set and the file system is updated to decommit the data in the SLC blocks. See, e.g., FIG. 17C. A read command involving the data is received at step 1428 and the data is read from the MLC block at step 1429. At step 1425, a read command involving the data is received before the expiration of the timer so that the bit is still "1" and the data is read from one or more of the SLC blocks at step 1426.

Note that detrapping is less of a problem for SLC blocks since there is typically more margin between the erased and programmed data states. As a result, an SLC bock can be read with relatively few errors before the detrapping time period has elapsed.

The read operations at steps 1426 and 1429 can use the nominal read voltages assuming the memory cells are in the equilibrium state.

Figure 15:
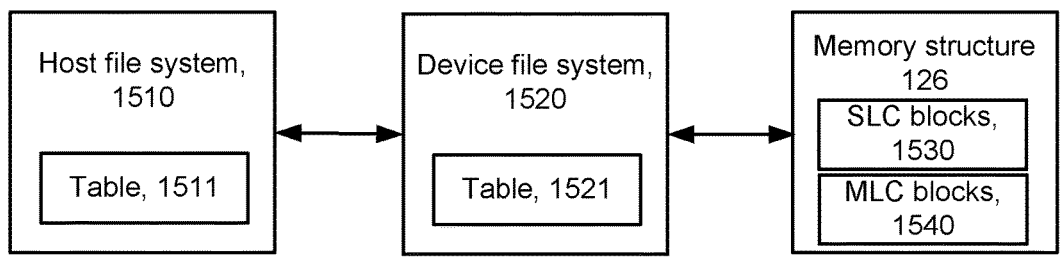
FIG. 15 depicts an example of file systems at a host and at a memory device.

FIG. 15 depicts an example of file systems at a host and at a memory device. When the host reads data from the memory device, the host does not know where the data is stored in the memory device. Instead, the data is identified by one or more logical addresses which are mapped to physical or virtual locations, e.g., block and word lines within the block, by a file system. A host file system 1510 includes one or more tables 1511 which cross reference files of data to logical block addresses (LBAs). For example, the file may be divided into sectors. A file can be a video, image, word processing document, application or other data. See, e.g., FIG. 16A

The memory device file system 1520 includes one or more tables 1521 which cross reference the LBAs to physical or virtual blocks and pages in the memory structure 126, which can include SLC blocks 1530 and MLC blocks 1540. See, e.g., FIG. 16B-16D and 17A-17C. There can be a direct or indirect mapping from the LBAs to physical addresses. In an example of indirect mapping, the LBA of the host is cross-referenced to a virtual address in the memory device, and the virtual address in the memory device is cross-referenced to a physical address. See, e.g., FIG. 19A-19E. An address which is mapped to or cross references another address is said to point to the other address.

FIG. 16A depicts an example host file system table 1511. The table includes a column for a file name and a column for a logical address. The file names identifies different files and their sectors. Each sector points to a corresponding logical address. In this simplified example, the logical addresses are consecutive numbers. Also, each file has the same number of sectors. In other cases, the logical addresses are non-consecutive and different files can have different numbers of sectors. The file/sectors and the corresponding logical addresses (LAs) are: file 1, sector 0: LA 0; file 1, sector 1: LA 1; file 1, sector 2: LA 2; file 2, sector 0: LA 3; file 2, sector 1: LA 4; file 2, sector 2: LA 5; file 3, sector 0: LA 6; file 3, sector 1: LA 7; and file 3, sector 2: LA 8.

FIG. 16B depicts an example device file system table 1521 when data is written to one block, consistent with FIG. 14A and 16A. The table includes a column for the logical address as in FIG. 16A, a physical address (e.g., block number and page number) for one block, a physical address for another block and a bit. The one block may be block 3 and the another block may be block 4 as in FIG. 18A. In this simplified example, the data of consecutive logical addresses is stored in consecutive pages of blocks. In other cases, the data is stored in non-consecutive pages. As mentioned in connection with FIG. 14A, the bit may have one value (e.g., 1) to indicate the logical block address points to the physical page address in the one block and another value (e.g., 0) to indicate the logical block address points to the physical page address in the another block. A control circuit is configured to change the bit from the one value to the another value in response to expiration of the timer.

For the one block, the data of the different logical addresses is stored in physical addresses as follows: block 3, page 0: LA 0; block 3, page 1: LA 1; block 3, page 2: LA 2; block 3, page 3: LA 3; block 3, page 4: LA 4; block 3, page 5: LA 5; block 3, page 6: LA 6; block 3, page 7: LA 7; and block 3, page 8: LA 8.

Since the data is not yet stored in the another block, the notation "n/a" or "not applicable" appears in the corresponding column.

FIG. 16C depicts the example device file system table 1521 of FIG. 16B when data is copied from the one block to another block. At this time, two copies of the data exist. A first copy is in the one block and a second copy is in the another block. For the another block, the data of the different logical addresses is stored in physical addresses as follows: block 3, page 0: LA 0; block 3, page 1: LA 1; block 3, page 2: LA 2; block 3, page 3: LA 3; block 3, page 4: LA 4; block 3, page 5: LA 5; block 3, page 6: LA 6; block 3, page 7: LA 7; and block 3, page 8: LA 8.

The bit remains at 1 until the timer expires, indicating that a read operation should be handled by reading from the one block and not the another block.

FIG. 16D depicts the example device file system table of FIG. 16C when the data in the one block is decommitted. At this time, the bit switches from 1 to 0, indicating that a read operation should be handled by reading from the another block and not the one block. Since the data in the one block is no longer needed, it is decommitted by removing a reference to it in the table. This is indicated by the notation "n/a" under the physical address for the one block.

FIG. 17A depicts an example device file system table when data is written to SLC blocks, consistent with FIG. 14B and 16A. Instead of referring to the physical addresses of the one block and the another block as in the previous example, the table 1521a refers to the physical addresses of SLC blocks and an MLC block. The SLC blocks may be blocks 0-2 and the MLC block may be block 3 as in FIG. 18B.

For the SLC blocks, the data of the different logical addresses is stored in physical addresses as follows: block 0, page 0: LA 0; block 0, page 1: LA 1; block 0, page 2: LA 2; block 1, page 0: LA 3; block 1, page 1: LA 4; block 1, page 2: LA 5; block 2, page 0: LA 6; block 2, page 1: LA 7; and block 2, page 2: LA 8.

Since the data is not yet stored in the MLC block, the notation "n/a" or "not applicable" appears in the corresponding column.

FIG. 17B depicts the example device file system table of FIG. 17A when data is copied from the SLC blocks to an MLC block. At this time, two copies of the data exist. A first copy is in the SLC blocks and a second copy is in the MLC block. For the MLC block, the data of the different logical addresses is stored in physical addresses as follows: block 3, page 0: LA 0; block 3, page 1: LA 1; block 3, page 2: LA 2; block 3, page 3: LA 3; block 3, page 4: LA 4; block 3, page 5: LA 5; block 3, page 6: LA 6; block 3, page 7: LA 7; and block 3, page 8: LA 8.

The bit remains at 1 until the timer expires, indicating that a read operation should be handled by reading from the SLC blocks and not the MLC block.

FIG. 17C depicts the example device file system table of FIG. 17B when the data in the SLC blocks is decommitted. At this time, the bit switches from 1 to 0, indicating that a read operation should be handled by reading from the MLC block and not the SLC blocks. Since the data in the SLC blocks is no longer needed, it is decommitted by removing a reference to them in the table. This is indicated by the notation "n/a" under the physical address for the SLC blocks.

FIG. 18A depicts an example of one block and another block, consistent with FIG. 14A and 16B to 16D. The one block, block 3, includes data on three word lines, as a simplified example. The another block, block 4, also includes data on three word lines. Moreover, three pages of data are stored in each word line, in this example. In block 3, pages 0, 1 and 2 are stored in a word line 1801, pages 3, 4 and 5 are stored in a word line 1802, and pages 6, 7 and 8 are stored in a word line 1803. In block 4, pages 0, 1 and 2 are stored in a word line 1811, pages 3, 4 and 5 are stored in a word line 1812, and pages 6, 7 and 8 are stored in a word line 1813.

FIG. 18B depicts an example of SLC blocks and an MLC block, consistent with FIG. 14B and 17A to 17C. Each SLC block includes data on three word lines, as a simplified example, and page of data is stored in each word line, in this example. The MLC block, block 3, also includes data on three word lines, and three pages of data are stored in each word line. In the SLC block 0, pages 0, 1 and 2 are stored in word lines 1851, 1852 and 1853, respectively. In the SLC block 1, pages 0, 1 and 2 are stored in word lines 1854, 1855 and 1856, respectively. In the SLC block 2, pages 0, 1 and 2 are stored in word lines 1857, 1858 and 1859, respectively.

Pages 0, 1 and 2 of SLC block 0 are stored in a first word line 1861 of MLC block 3 as pages 0, 1 and 2, respectively. Pages 0, 1 and 2 of SLC block 1 are stored in a second word line 1862 of MLC block 3 as pages 3, 4, and 5, respectively. Pages 0, 1 and 2 of SLC block 2 are stored in a third word line 1863 of MLC block 3 as pages 6, 7 and 8, respectively.

The three pages of an SLC block may be stored as lower, middle and upper pages, respectively of a word line in the MLC block.

Figure 18C:
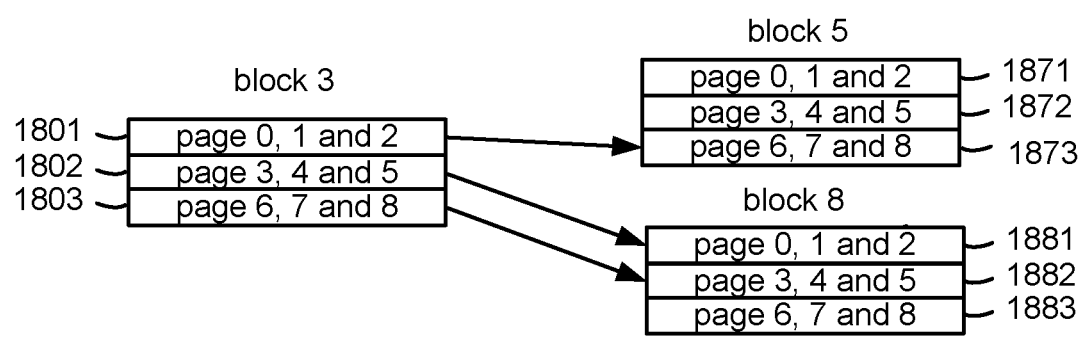
FIG. 18C depicts a mapping of a virtual block (block 3) to physical blocks (blocks 5 and 8).

FIG. 18C depicts a mapping of a virtual block (block 3) to physical blocks (blocks 5 and 8). As mentioned, a virtual block comprises page of data which can be stored in one or more physical blocks. In this example, the data of the word line (e.g., virtual word line) 1801 is stored in physical word line 1873 of physical block 5, and the data of the word lines 1802 and 1803 is stored in physical word lines 1881 and 1882, respectively, of block 8. The data of a virtual block can be stored in one or more physical blocks. The physical block 5 includes word lines 1871, 1872 and 1873. The physical block 8 includes word lines 1881, 1882 and 1883. Each word lines stores three pages, e.g., pages 0, 1 and 2; pages 3, 4 and 5; or pages 6, 7 and 8.

FIG. 19A depicts another example device file system table when data is written to SLC blocks, consistent with FIG. 14A and 16A, and virtual blocks are used. The logical addresses are front end block addresses of 0-8. The data of the different front end block addresses (FBA) 0-8 is stored in SLC virtual block addresses (SLC_VBA) of SLC_VBA0-SLC VBA8, respectively. Since the data is not yet stored in the MLC virtual blocks, the notation "n/a" or "not applicable" appears in the corresponding column.

FIG. 19B depicts the example device file system table of FIG. 19A when data is copied from the SLC blocks to an MLC block. At this time, two copies of the data exist. A first copy is in the SLC virtual blocks and a second copy is in the MLC virtual blocks. For the MLC virtual blocks, the data of the FBAs 0-8 is stored in the MLC virtual block addresses of MLC_VBA0-MLC_VBA8, respectively.

FIG. 19C depicts the example device file system table of FIG. 19B when the data in the SLC blocks is decomitted. At this time, the bit switches from 1 to 0, indicating that a read operation should be handled by reading from the MLC virtual blocks and not the SLC virtual blocks. Since the data in the SLC virtual blocks is no longer needed, it is decomitted by removing a reference to them in the table. This is indicated by the notation "n/a" under the physical address for the SLC virtual blocks.

FIG. 19D depicts an example device file system table 1521b which shows a mapping from SLC virtual block addresses to SLC physical addresses, consistent with FIG. 19A to 19C. SLC_VBA0, SLC_VBA1, SLC_VBA2, SLC_VBA3, SLC_VBA4, SLC_VBA5, SLC_VBA6, SLC_VBA7 and SLC_VBA8 are mapped, or point to, to block 0, page 0; block 0, page 1; block 0, page 2; block 1, page 1; block 1, page 1; block 1, page 2; block 2, page 0; block 2, page 1 and block 2, page 2; respectively.

FIG. 19E depicts an example device file system table 1521c which shows a mapping from MLC virtual block addresses to MLC physical addresses, consistent with FIG. 19A to 19C. MLC_VBA0, MLC_VBA1, MLC_VBA2, MLC_VBA3, MLC_VBA4, MLC_VBA5, MLC_VBA6, MLC_VBA07 and MLC_VBA8 are mapped to block 3, page 0; block 3, page 1; block 3, page 2; block 3, page 3; block 3, page 4; block 3, page 5; block 3, page 6; block 3, page 7 and block 3, page 8; respectively.

Figure 20:
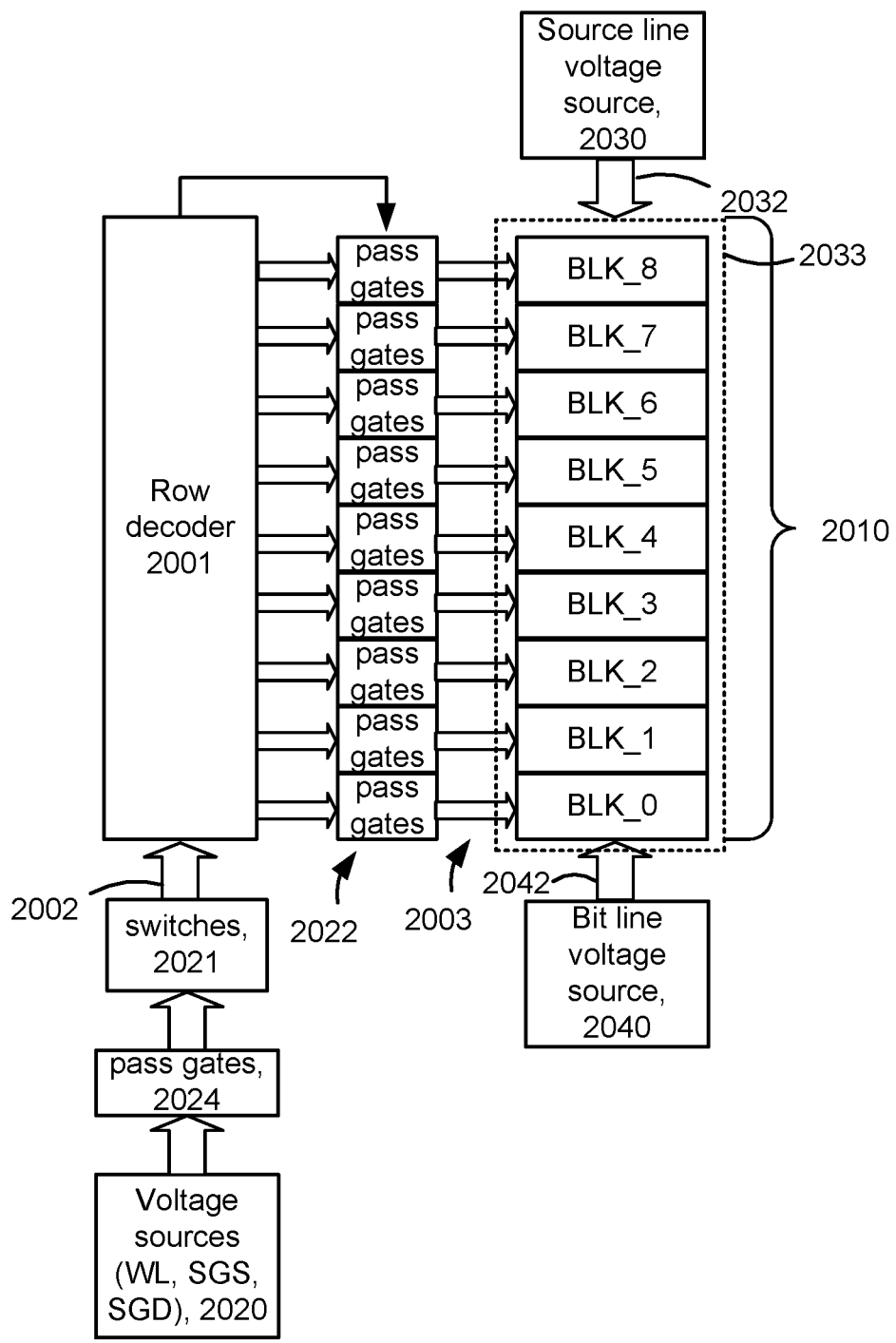
FIG. 20 depicts an example circuit for providing voltages to blocks of memory cells.

FIG. 20 depicts an example circuit for providing voltages to blocks of memory cells. In this example, a row decoder 2001 provides voltages to word lines and select gates of each block in set of blocks 2010. The set could be in a plane and includes blocks BLK 0 to BLK 8. The row decoder provides a control signal to pass gates 2022 which connect the blocks to the row decoder. Typically, operations, e.g., program, read or erase, are performed on one selected block at a time. The row decoder can connect global control lines 2002 to local control lines 2003. The control lines represent conductive paths. Voltages are provided on the global control lines from voltage sources 2020. The voltage sources may provide voltages to switches 2021 which connect to the global control lines. Pass gates 2024, also referred to as pass transistors or transfer transistors, are controlled to pass voltages from the voltage sources 2020 to the switches 2021.

The voltage sources 2020 can provided voltages on word lines (WL), SGS control gates and SGD control gates, for example.

The various components, including the row decoder, may receive commands from a controller such as the state machine 112 or the controller 122 to perform the functions described herein.

A source line voltage source 2030 provides an erase voltage to the source lines/diffusion region in the substrate via control lines 2032. In one approach, the source diffusion region 2033 is common to the blocks. A set of bit lines 2042 is also shared by the blocks. A bit line voltage source 2040 provides voltages to the bit lines.

In one implementation, an apparatus comprises: a plurality of blocks of memory cells; and a control circuit. The control circuit is configured to: store a page of data received from a host in one block of the plurality of blocks; copying the page of data from the one block to another block of the plurality of blocks; in response to completion of the copying, start a timer; if a request to read the page is received before expiration of the timer, e.g., while the time is counting down, read the page from the one block; and if a request to read the page is received after expiration of the timer, read the page from the another block.

In another implementation, an apparatus comprises: means for copying data in a plurality of blocks of single-level memory cells to a block of multi-level memory cells in a folding operation; mean for determining if a time period has elapsed since completion of the copying; and means for pointing to the block of multi-level memory cells if the time period has elapsed and pointing to the plurality of blocks of single-level memory cells if the time period has not yet elapsed.

The means described above can include the components of the memory device 100 of FIG. 1A, 1B and FIG. 2, for example. The power control module 116, for instance, controls the power and voltages supplied to the word lines, select gate lines and bit lines during memory operations. Moreover, the means described above can include the components of FIG. 20 including the decoders, voltage drivers, switches and pass transistors. The means can further include any of the control circuits in FIG. 1A, 1B and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of blocks of memory cells; and
a control circuit, the control circuit is configured to:

program a page of data received from a host in one block of the plurality of blocks;

in response to completion of the programming, start a first timer;

copying the page of data from the one block to another block of the plurality of blocks;

in response to completion of the copying, start a second timer;

when a request to read the page is received before expiration of the first timer, delay reading the page from the one block until the first timer has expired; and when a request to read the page is received after expiration of the second timer, read the page from the another block.

2. The apparatus of claim 1, wherein:

the plurality of blocks comprise a virtual block; and the virtual block comprise multiple physical blocks.

3. The apparatus of claim 1, wherein:

the one block comprises single-level memory cells;

the another block comprises multi-level memory cells; and a control circuit is configured to start the copying in response to the one block being full.

4. The apparatus of claim 1, wherein:

the control circuit is configured to start the copying of the one block to the another block along with copying of an additional block of single-level memory cells to the another block in a folding operation.

5. The apparatus of claim 1, wherein:

the control circuit is configured to evaluate a portion of the page in the one block using an error correction code and confirm that no uncorrectable errors exist in the portion of the page in the one block before starting the copying.

6. The apparatus of claim 1, wherein:

the first timer indicates whether a short term data retention period has elapsed for the one block; and the second timer indicates whether a short term data retention period has elapsed for the another block.

7. The apparatus of claim 1, wherein:

the control circuit is configured to modify a file system in response to expiration of the second timer to cause a logical block address to point to the another block instead of pointing to the one block.

8. The apparatus of claim 7, wherein:

the file system comprises a table;

the table comprises a bit, the bit having one value to indicate the logical block address points to the one block and another value to indicate the logical block address points to the another block; and the control circuit is configured to change the bit from the one value to the another value in response to expiration of the second timer.

9. The apparatus of claim 1, wherein:

the first timer indicates whether a data retention period has elapsed for the one block; and the second timer indicates whether a data retention period has elapsed for the another block.

10. The apparatus of claim 1, wherein:

a duration of the first timer increases when a temperature decreases.

11. A method, comprising:

programming a page of data to one block;

starting a first timer in response to completion of the programming;

copying the page of data from the one block to another block;

starting a second timer in response to completion of the copying;

receiving a request to read the page after the starting of the first timer and when the first timer has not yet expired; and delaying reading of the page from the one block until the first timer has expired.

12. The method of claim 11, further comprising:

copying the page from the one block to the another block along with copying of an additional page of an additional block to the another block when the one block and the additional block become full.

13. The method of claim 11, wherein:

the page of data is copied from single-level memory cells in the one block to multi-level memory cells in the another block.

14. The method of claim 11, further comprising:

in response to expiration of the second timer, modifying a file system to cross reference a logical block address to the another block in place of the one block.

15. The method of claim 11, further comprising:

increasing a duration of the first timer when a temperature decreases.

16. The method of claim 11, wherein:

the reading the page from the another block uses a nominal read voltage.

17. An apparatus, comprising:

means for programming data in one block;

a first timer which indicates whether a short term data retention period has elapsed for the one block since completion of the programming;

means for copying the data from the one block to another block;

a second timer which indicates whether a short term data retention period has elapsed for the another block since completion of the copying; and means for reading the data from the one block in response to a read command, wherein the reading of the data occurs from the one block when the first timer expires, when the read command is received before the first timer expires.

18. The apparatus of claim 17, wherein:

the reading of the data occurs from the one block when the read command is received after expiration of the first timer and before expiration of the second timer.

19. The apparatus of claim 17, wherein:

the reading of the data occurs from the another block when the read command is received after expiration of the first timer and the second timer.

20. The apparatus of claim 17, wherein:

the short term data retention period for the one block increases when a temperature decreases.

* * * * *